US012630922B2

(12) United States Patent
Kamarehi et al.

(10) Patent No.: US 12,630,922 B2
(45) Date of Patent: May 19, 2026

(54) MICROWAVE SYSTEM FOR MICROWAVE-ASSISTED SURFACE CHEMISTRY ANNEALING OF ALD PROCESSES UTILIZING MICROWAVE RADIATION ENERGY

(71) Applicant: MKS Instruments, Inc., Andover, MA (US)

(72) Inventors: Mohammad Kamarehi, Andover, MA (US); Ilya Pokidov, Andover, MA (US); Kenneth B Trenholm, Andover, MA (US)

(73) Assignee: MKS Inc., Andover, MA (US)

( * ) Notice: Subject to any disclaimer, the term of this patent is extended or adjusted under 35 U.S.C. 154(b) by 0 days.

(21) Appl. No.: 17/590,874

(22) Filed: Feb. 2, 2022

(65) Prior Publication Data

US 2022/0243333 A1     Aug. 4, 2022

Related U.S. Application Data

(60) Provisional application No. 63/145,178, filed on Feb. 3, 2021.

(51) Int. Cl.
*C23C 16/455*          (2006.01)
*C23C 16/46*           (2006.01)
(Continued)

(52) U.S. Cl.
CPC .. *C23C 16/45544* (2013.01); *C23C 16/45536* (2013.01); *C23C 16/46* (2013.01);
(Continued)

(58) Field of Classification Search
CPC ......... H01J 37/32192–32311; H01J 37/32724; H01J 37/32357; C23C 16/45544;
(Continued)

(56) References Cited

U.S. PATENT DOCUMENTS 5,302,803 A * 4/1994 Stevens ............. H01J 37/32229
219/121.41
5,961,851 A * 10/1999 Kamarehi ......... H01J 37/32192
204/298.38
(Continued)

FOREIGN PATENT DOCUMENTS

DE      102018000401 A1 * 7/2019   ........ H01J 37/32192
JP          2002-299330 A    10/2002
(Continued)

OTHER PUBLICATIONS

"Coax or Waveguide Interconnect? Which one should you use?" Published Jul. 20, 2017 on Pasternack.com (Year: 2017).*
(Continued)

*Primary Examiner* — Kurt Sweely

(57)          ABSTRACT

A microwave system for use within a microwave-assisted thermal atomic layer deposition system is disclosed which include at least one microwave generator configured to output at least one microwave signal, at least one waveguide assembly in communication with the at least one microwave generator and configured to receive the microwave signal, one or more isolators positioned within the waveguide assembly and configured to reduce or eliminate backscatter of the microwave signal from the waveguide assembly to the at least one microwave generator, at least one tuning device in positioned within the waveguide assembly and configured receive the microwave signal from the isolator and tune the microwave signal, and at least one microwave delivery device in communication with the waveguide assembly and configured to direct at least a portion of the microwave signal into at least one processing chamber of the microwave-assisted thermal atomic layer deposition system.

25 Claims, 7 Drawing Sheets

(51) Int. Cl.
    *C23C 16/511*         (2006.01)
    *H01J 37/32*         (2006.01)
    *H10P 72/00*         (2026.01)

(52) U.S. Cl.
    CPC ...... *C23C 16/511* (2013.01); *H01J 37/32192* (2013.01); *H01J 37/32724* (2013.01); *H10P 72/0436* (2026.01); *H01J 37/32229* (2013.01); *H01J 37/32357* (2013.01)

(58) Field of Classification Search
    CPC . C23C 16/45536; C23C 16/46; C23C 16/511; H10P 72/0436
    See application file for complete search history.

(56) References Cited

U.S. PATENT DOCUMENTS

| | | | |
|---|---|---|---|
| 9,543,123 B2 * | 1/2017 | Ikeda | H01J 37/32449 |
| 2002/0007912 A1 | 1/2002 | Kamarehi et al. | |
| 2012/0299671 A1 * | 11/2012 | Ikeda | H05H 1/46 |
| | | | 333/248 |
| 2013/0256803 A1 * | 10/2013 | Clark | H10D 84/0177 |
| | | | 257/E27.06 |
| 2014/0197761 A1 * | 7/2014 | Grandemenge ... | H01J 37/32302 |
| | | | 219/709 |
| 2014/0262034 A1 | 9/2014 | Ishibashi et al. | |
| 2015/0056107 A1 | 2/2015 | Hancock | |
| 2015/0214011 A1 | 7/2015 | Kaneko et al. | |
| 2016/0222516 A1 | 8/2016 | Ikeda et al. | |
| 2018/0269037 A1 * | 9/2018 | Kamarehi | H01J 37/32266 |
| 2019/0080886 A1 * | 3/2019 | Kaplan | H05B 6/686 |
| 2020/0312639 A1 * | 10/2020 | Tom | B01J 19/088 |
| 2021/0005430 A1 | 1/2021 | Kamarhei et al. | |
| 2021/0084743 A1 | 3/2021 | Spitzl | |

FOREIGN PATENT DOCUMENTS

| | | |
|---|---|---|
| JP | 2011014542 A2 | 1/2011 |
| JP | 2012-216525 A | 11/2012 |
| JP | 2014007343 A | 1/2014 |
| JP | 2014035887 A | 2/2014 |
| JP | 5916534 B2 | 5/2016 |
| JP | 2017004641 A | 1/2017 |
| JP | 2020512659 A | 4/2020 |
| JP | 2021-007133 A | 1/2021 |
| TW | 201331408 A | 8/2013 |
| WO | 2018/169600 A1 | 9/2018 |

OTHER PUBLICATIONS

The Search Report issued for PCT counterpart application No. PCT/US2022/014816 dated May 11, 2022 (3 pages).

The Written Opinion issued for PCT counterpart application No. PCT/US2022/014816 dated May 11, 2022 (7 pages).

Extended European Search Report for EP counterpart application No. 22750273.9 dated Feb. 17, 2025 (8 pages).

Translation of Office Action issued for TW counterpart application No. 111104114 dated Mar. 17, 2025 (14 pages).

Office Action report issued in JP counterpart application No. 2023-547068 dated May 19, 2025 (8 pages).

Office Action report issued in CN counterpart application No. 202280013028.1 dated May 20, 2025 (19 pages).

Office Action report issued in JP counterpart application No. 2023-547068 dated Sep. 29, 2025. (4 pages).

* cited by examiner

MICROWAVE SYSTEM FOR MICROWAVE-ASSISTED SURFACE CHEMISTRY ANNEALING OF ALD PROCESSES UTILIZING MICROWAVE RADIATION ENERGY

CROSS-REFERENCE TO RELATED APPLICATIONS

The present application claims priority to U.S. provisional Pat. Appl. Ser. No. 63/145,178, entitled "Apparatus and Methods for Microwave-Assisted Surface Chemistry Annealing of ALD Processes Utilizing Microwave Radiation Energy," filed on Feb. 3, 2021, the contents of which are incorporated by reference in its entirety herein.

TECHNICAL FIELD

Embodiments of the present invention are directed to systems and methods for utilizing microwave radiation energy for improving annealing during atomic layer deposition processes.

BACKGROUND

Semiconductor fabrication incorporates a wide variety of processing techniques. Atomic layer deposition (hereinafter ALD) is one such manufacturing process. The ALD process is commonly used in the fabrication of semiconductor devices, synthesis of nanomaterials, and is frequently used to treat or otherwise conditioned dielectric films to achieve a dense dielectric, low-k film on a material. ALD thin-film deposition techniques are typically based on the sequential use of a gas phase chemical process wherein multiple precursors (also called "reactants") are sequentially reacted with the surface of a material to slowly deposit a multi-layer thin film on the surface of the material.

Thermal ALD is achieved by using traditional rapid thermal annealing based on light radiation thermal processing. While traditional rapid thermal ALD processing has proven useful in the past, a number of shortcomings have been identified. For example, the temperature of the wafer being processed increases to the annealing temperature during rapid thermal ALD. As a result, processing times tend to be longer than desired due to heating and cooling of the substrate during processing. Further, obtaining denser dielectric, low-k layer has proven challenging.

In light of the foregoing, there is an ongoing need for a system and method for microwave-assisted ALD annealing capable of providing high processing throughput as compared with traditional rapid thermal ALD system and processes.

SUMMARY

Various embodiments of microwave-assisted thermal ALD processing systems are disclosed in the present application. In one embodiment, the microwave-assisted thermal ALD processing system disclosed herein utilizes microwave radiation during the deposition process thereby reducing or eliminating processing time associated with heating and cooling the substrate before, during, and after processing of the substrate thereby improving process throughput. Further, systems and methods disclosed herein may be configured to achieve more dense films or layers applied to a substrate than currently available. In addition, the embodiments of the microwave-assisted thermal ALD processing systems disclosed herein permit the formation of denser dielectric, low-k layers of material on a substrate.

In one embodiment, the present application discloses a microwave system for use with a microwave-assisted thermal atomic layer deposition system. More specifically, the microwave system may include at least one microwave generator configured to output at least one microwave signal. At least one waveguide assembly in communication with the at least one microwave generator may be configured to receive the microwave signal. One or more isolators positioned within the waveguide assembly may be configured to reduce or eliminate backscatter of the microwave signal from the waveguide assembly to the microwave generator, thereby reducing the likelihood of damage to the microwave generator. At least one tuning device in positioned within the waveguide assembly and may be configured receive the microwave signal from the isolator and tune the microwave signal. The tuning system may comprise an auto-tune tuning system or, in the alternative, a manual tuning system. Finally, at least one microwave delivery device in communication with the waveguide assembly may be configured to direct at least a portion of the microwave signal into at least one processing chamber of the microwave-assisted thermal atomic layer deposition system.

In another embodiment, the present application is directed to a waveguide-based microwave system for use with a microwave-assisted thermal atomic layer deposition system. Specifically, the microwave system may include at least one microwave generator configured to output at least one microwave signal. At least one waveguide assembly in communication with the at least one microwave generator may be configured to receive the microwave signal. One or more isolators positioned within the waveguide assembly may be configured to reduce or eliminate backscatter of the microwave signal from the waveguide assembly to the microwave generator, thereby reducing the likelihood of damage to the microwave generator. At least one tuning device in positioned within the waveguide assembly may be configured receive the microwave signal from the isolator and tune the microwave signal. The tuning system may comprise an auto-tune tuning system or, in the alternative, a manual tuning system. Finally, at least one waveguide in communication with the at least one waveguide assembly may be configured to direct at least a portion of the microwave signal into a processing chamber of the microwave-assisted thermal atomic layer deposition system.

In still another embodiment, the present application is directed to a helical-antenna-based microwave system for use with a microwave-assisted thermal atomic layer deposition system. More specifically, the microwave system may include at least one microwave generator configured to output at least one microwave signal. At least one waveguide assembly in communication with the at least one microwave generator may be configured to receive the microwave signal. One or more isolators positioned within the waveguide assembly may be configured to reduce or eliminate backscatter of the microwave signal from the waveguide assembly to the microwave generator, thereby reducing the likelihood of damage to the microwave generator. At least one tuning device in positioned within the waveguide assembly may be configured receive the microwave signal from the isolator and tune the microwave signal. The tuning system may comprise an auto-tune tuning system or, in the alternative, a manual tuning system. Finally, at least one helical antenna in communication with the at least one waveguide assembly may be configured to direct at least a portion of the microwave signal into a processing chamber of the microwave-assisted thermal atomic layer deposition system.

Other features and advantages of the microwave system for use within a microwave-assisted thermal apparatus and methods of use will become more apparent from a consideration of the following detailed description.

BRIEF DESCRIPTION OF THE DRAWINGS

The novel aspects of the microwave system for use within a microwave-assisted thermal apparatus and methods of use will become more apparent from a consideration of the following figures, wherein.

DETAILED DESCRIPTION

The present application is directed to various microwave systems and methods for improved thermal ALD processing by incorporating various microwave generating devices and processes. In one embodiment, the present application discloses system and methods for microwave-assisted thermal ALD processing which applies microwave radiation to the deposited layers of material after each sequential layer is deposited onto the substrate, thereby selectively raising the temperature of the deposited film while reducing or eliminating time associated with thermal ramping associated with heating the substrate to which the film is applied. As a result, the Applicants have produced higher quality films, films having a denser dielectric and low-k films, and films offer a broader use across the thermal ALD application spectrum. In one embodiment, the systems and methods of microwave-assisted ALD thermal annealing disclosed herein may be used in conjunction with plasma processing of various substrates. In another embodiment, the systems and methods of microwave-assisted ALD thermal annealing disclosed herein need not be used in conjunction with plasma processing. Rather, any various of post-ALD annealing may be used with the present systems and methods.

Figure 2:
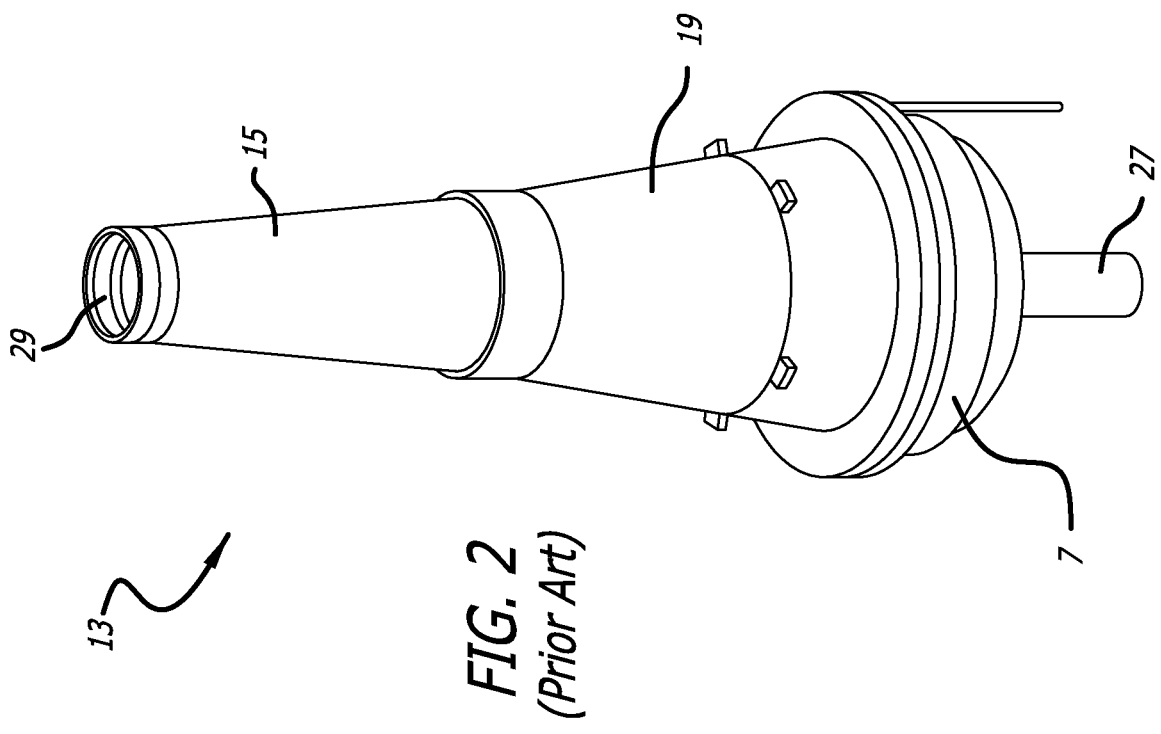
FIG. 2 shows an elevated perspective view of a vessel coupled to a platen vessel used in the thermal ALD processing system shown in FIG. 1.
Figure 1:
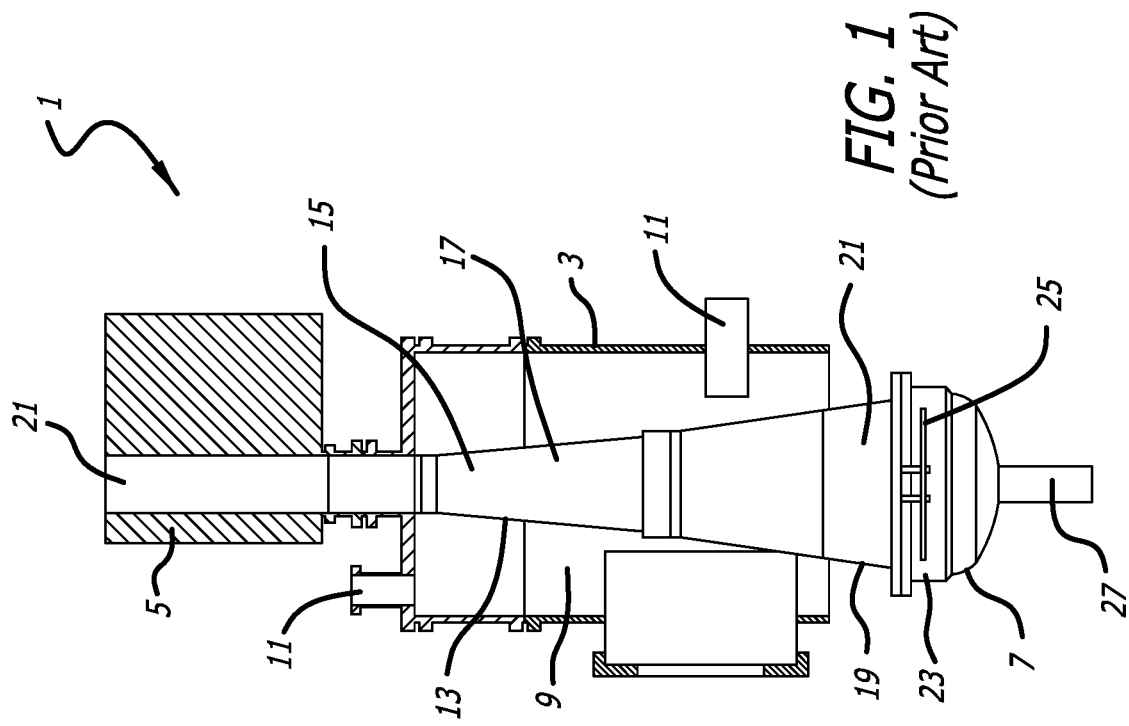
FIG. 1 shows a planar cross-sectional view of an embodiment of a prior art thermal ALD processing system.

FIGS. 1 and 2 show various views of the elements used in constructing an embodiment of a conventional thermal ALD processing chamber for use in the atomic layer deposition of materials onto a substrate. As shown, the ALD system 1 includes a chamber 3 in fluid communication with a plasma source 5. Further, a chamber receiving area 9 may be formed within the chamber 3. In addition, the chamber 3 may have one or more ports 11 formed thereon. The chamber receiving area 9 may be sized to receive a vessel 13 therein. In one embodiment, the vessel 13 comprises a conical vessel formed from a first vessel body 15 and a second vessel body 19. As shown, the first vessel body 15 defines a first vessel passage 17 therein. Similarly, the second vessel body 19 defines a second vessel passage 21 which is in fluid communication with the first vessel passage 17.

Referring again to FIGS. 1 and 2, at least one platen vessel 7 may be coupled to and in fluid communication with the vessel 13. The platen vessel 7 defines a platen vessel chamber 23 having a platen fixture 25 configured to receive one or more substrates, coupons, or similar specimens therein or thereon. During use, the substrate to be processed is positioned one the platen fixture 25 located within the platin vessel chamber 23. A vacuum is formed within the chamber and the temperature of the substrate is heated to a desired temperature. Thereafter, multiple reactants are sequentially introduced into platen vessel chamber 23. As a result, multiple atomic layers are formed on the substrate. Thereafter, once the desired number and/or thickness of layers are formed on the substrate a plasma generated within the plasma source 5 is directed into and traverses through the vessel 13 via the inlet 29 formed on the vessel 13. The plasma may then be incident on a substrate positioned on the platen fixture 25 positioned on the platen fixture 25 located within the platen vessel chamber 23. Once processing is completed, the substrate must cool over time to a handling temperature before the coated substrate may be removed from the chamber, thereby greatly reducing the throughput of the processing system.

Figure 4:
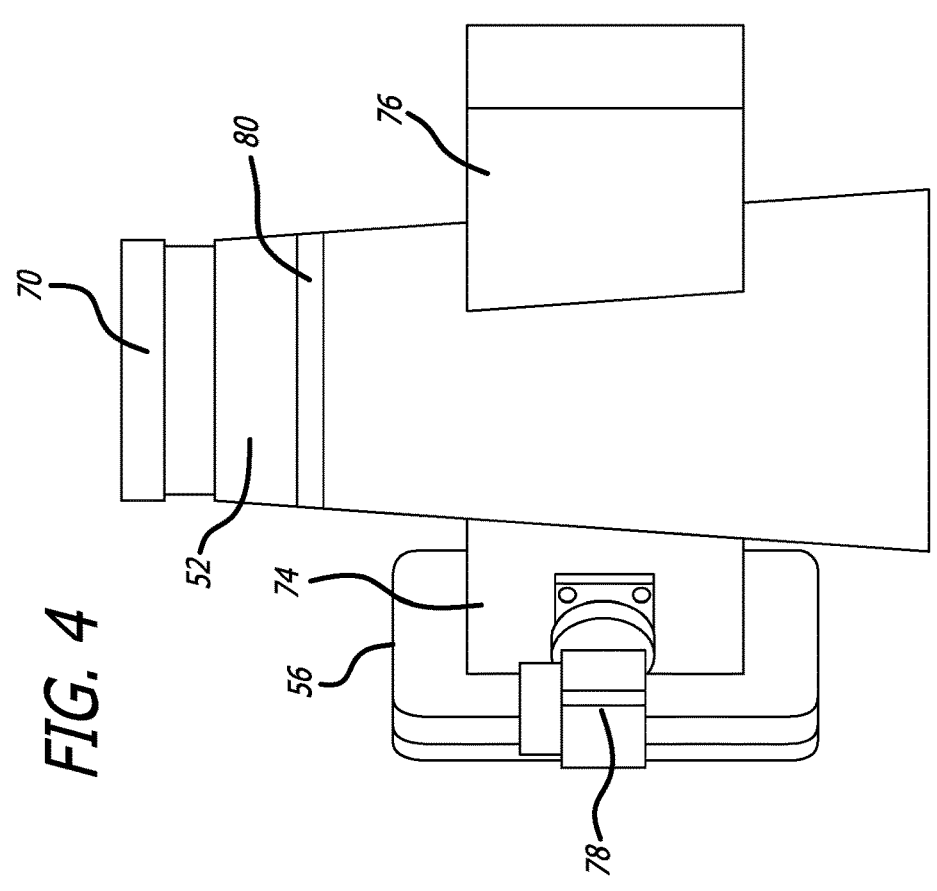
FIG. 4 shows a side perspective view of an embodiment of a microwave waveguide positioned on the processing vessel of the microwave-assisted thermal ALD processing system shown in FIG. 3.
Figure 3:
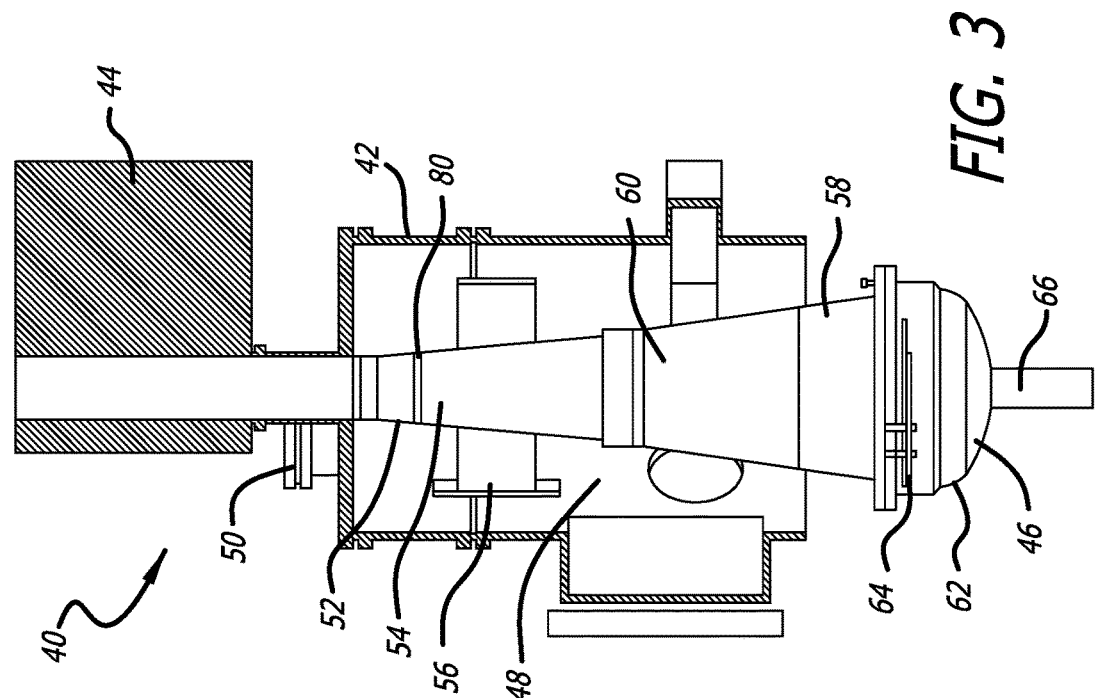
FIG. 3 shows a planar cross-sectional view of an embodiment of a microwave-assisted thermal ALD processing systems having at least one microwave waveguide positioned on a processing vessel.
Figure 5:
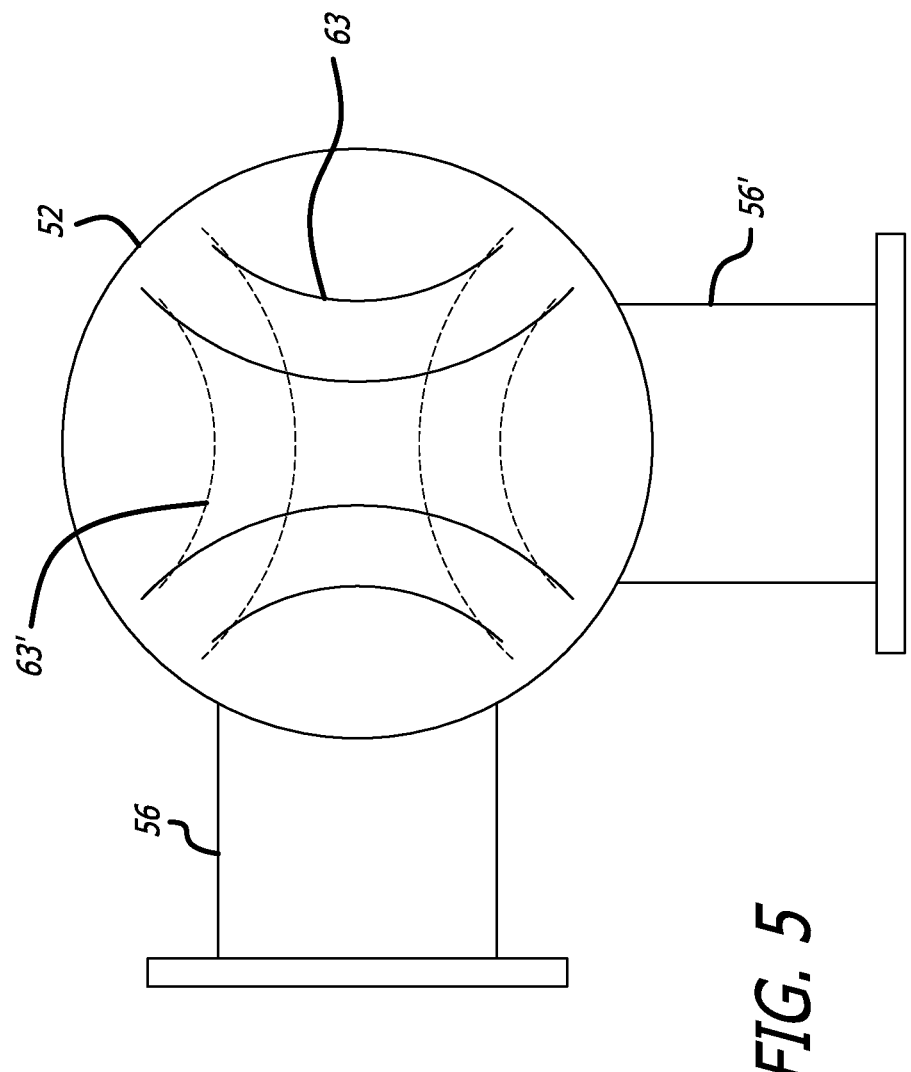
FIG. 5 shows a top view another embodiment of the processing vessel of the microwave-assisted thermal ALD processing system shown in FIG. 3 having two (2) microwave waveguides positioned thereon.

FIGS. 3-5 show an embodiment of a novel microwave-assisted thermal ALD processing system. As shown, the microwave-assisted thermal ALD system 40 includes a chamber 42 having at least one plasma source 44 coupled thereto or otherwise in fluid communication therewith. Like the conventional thermal ALD system described above, the chamber 42 of the ALD system 40 shown in FIG. 3-5 defines at least one chamber receiving area 48 configured to receive one or more processing vessels 52 therein. Further, at least one of the chamber 42 and/or the vessel 52 may be coupled to at least one platen vessel 46 and configured to receive and support at least one substrate, platen, or substrate therein. In the illustrated embodiment, the vessel 52 comprises a conical vessel. Optionally, the vessel 52 may be formed in any variety of shapes, configurations, transverse dimensions, and the like. Further, the vessel 52 may be manufactured from any variety of materials, including, without limitations, stainless steel, various alloys, various inert materials, ceramics, composite materials, glass, minerals, and the like. In one embodiment, at least one of the chamber 42, vessel 52, and/or the platen chamber may be sized to receive one or more 100 mm or smaller wafer substrates therein. Optionally, at least one of the chamber 42, vessel 52, and/or the platen chamber may be sized to receive one or more 100 mm or larger wafer substrates therein.

In the illustrated embodiment, the vessel 52 includes a first vessel body 54 and at least a second vessel body 58. Any number of vessel bodies may be used to form the vessel 52. Optionally, the vessel 52 may be formed in a monolithic configuration. At least one vessel passage 60 may be formed within the vessel 52. Unlike the conventional thermal ALD system described above, the microwave-assisted thermal ALD system described in FIGS. 3-5 includes at least one microwave waveguide device 56 configured to direct microwave radiation from a microwave generator (not shown) to a substrate in communication with the vessel passage 60 formed in the vessel 52. For example, in the embodiments shown in FIGS. 3 and 4, a single microwave waveguide device 56 is positioned on or in communication the first vessel body 54. In the alternative, FIG. 5 shows a schematic diagram of an elevated cross-sectional view of an alternate embodiment of the vessel 52 having two (2) microwave waveguide devices 56, 56' positioned on the vessel 52. In the illustrated embodiment, the microwave waveguide devices 56 and 56' are positioned orthogonal to each other, although those skilled in the art will appreciate that the microwave waveguide devices 56 and 56' may be positioned in any relation to each other. As such, at shown, the first microwave waveguide device 56 may be configured to deliver a first microwave radiation field 63 to a substrate being processed. Similarly, the microwave waveguide device 56' may be configured to deliver at least a second microwave radiation field 63' to a substrate being processed by the microwave-assisted thermal ALD system 40. For example, the mode of the first radiation field 63 may be $TE_{11}$ mode in a desired plane (e.g. r & φ plane) while the mode of the second radiation field 63' may comprise $TE_{11}$ mode in a different plane (e.g. vector of the r & φ plane). Optionally, at least one of the first and second microwave radiation fields 63, 63' may be linearly polarized, circularly polarized, and/or elliptically polarized. Further, in one embodiment, the first and second microwave radiation fields 63, 63' share the same polarization. In another embodiment the first and second microwave radiation fields 63, 63' have different polarizations. Those skilled in the art will appreciate that the modes of the first and second radiation fields 63, 63' may be the same or different. For example, exemplary modes include $TE_{11}$, $TM_{01}$, and the like. Further, the microwave waveguide device 56 and/or 56' (if present) may be configured to provide microwave radiation at any variety of frequencies. Exemplary frequencies may range from about two hundred megahertz (200 MHz) to about ten thousand megahertz (10,000 MHz) or more. In another embodiment, the frequencies may range from about five thousand seven hundred megahertz (5700 MHz) to about five thousand eight hundred megahertz (5800 MHz). Optionally, the frequencies may range from about one thousand megahertz (1000 MHz) to about four thousand megahertz (4000 MHz) or more. Optionally, frequencies may range from about two thousand four hundred megahertz (2400 MHz) to about two thousand five hundred megahertz (2500 MHz). Further, those skilled in the art will appreciate that the frequencies of the first and second radiation fields 63, 63' may be the same or different.

FIGS. 3 and 4 show various views of an embodiment of a microwave waveguide device 56 positioned on or otherwise coupled to the vessel 52. As shown, the microwave waveguide device 56 may include a first microwave waveguide body 74 and the second microwave waveguide body 76 coupled to the vessel 52. In one embodiment, the microwave waveguide device 56 may form a rectangular shape. Optionally, the waveguide device 56 may form a cylindrical shape. Those skilled in the art will appreciate that the waveguide device 56 may be formed in any variety of shapes, size, transverse dimensions, and the like. One or more microwave waveguide connectors 78 may be coupled to position on at least one of the first microwave waveguide body 74 and/or second microwave waveguide body 76. In one embodiment, the connector 78 may be configured to couple the microwave waveguide device 56 to at least one source of microwave energy (not shown). For example, the connector may be coupled to one or more conduits 186 in communication with at least one microwave generator 162 (see FIG. 10). As such, the port 50 formed on the chamber 42 may be configured to have one or more conduits, cables, or similar devices traverse there through. For example, in one embodiment, the port 50 includes at least one sealed connector similar device (not shown). In the illustrated embodiment microwave waveguide device 56 is located proximate to the vessel inlet 70 formed on the vessel 52. Those skilled in the art will appreciate that the one or more microwave waveguide devices 56 included in the present system may be positioned anywhere on or proximate to the vessel 52. As shown in FIGS. 3 and 4 at least one radiation choke or similar filtering device 80 may be positioned between the vessel inlet 70 the microwave waveguide device 56. In one embodiment the radiation choke 80 may be configured to prevent the unwanted flow of radiation or signal generated within the microwave waveguide device 56 from flowing into the plasma source 44.

Referring again to FIG. 3, at least one platen vessel 46 may be coupled to or otherwise in communication with the vessel 52 positioned within the chamber 42. In the illustrated embodiment, the platen vessel 46 is coupled to the vessel 52 external of the chamber 42. Optionally, the platen vessel 46 may be coupled to the vessel 52 within the chamber 42. In one embodiment, the platen vessel 46 defines at least one platen vessel chamber 62 therein, the platen vessel chamber 62 configured to house one or more platen fixtures 64 capable of supporting one or more substrates or specimens to be processed thereon or therein. One or more outlets 66 may be formed on platen vessel 46.

During a processing procedure one or more substrates or specimens (not shown) may be positioned on and/or secured to the platen fixture 64 within the platen vessel chamber 62 of the platen vessel 46. Thereafter, the platen vessel 46 is configured to engage the vessel 52 in sealed relation. For example, the platen vessel 46 made engaged the vessel 52 in a hermetically sealed relation, although those skilled in the art will appreciate that the platen vessel 46 may be coupled to the vessel 52 in any variety of manners. A vacuum may be applied to at least one of the chamber 42, the vessel chamber 62, and/or the platen vessel 46. Thereafter, one or more layers of reactants may be selectively deposited on to the substrate. In one embodiment, microwave energy emitted from the microwave waveguide device 56 and or 56' may be activated after each layer of material is sequentially deposited onto the substrate, thereby selectively and controllably heating the newly deposited layer formed on the substrate. In one embodiment, the microwave radiation is uniformly applied to the freshly deposited layer. In another embodiment, the microwave radiation in non-uniformly applied to the freshly deposited layer. In the illustrated embodiment, a plasma generated by the plasma source 44 may be directed to the vessel passage 60 to the substrate positioned on the platen fixture 64. Those skilled in the art will appreciate that any variety of alternate-post-ALD annealing processes may be performed to the substrate. As such, the systems and methods disclosed herein should not be construed as being limited to plasma-based processing systems.

FIGS. 6-9 show various views of another embodiment of microwave-assisted thermal ALD processing system. As shown, like the previous embodiment, the processing system 100 includes at least one chamber 102 positioned between or adjacent to at least one plasma source 104 and at least one platen vessel 106. The chamber 102 defines at least one chamber receiving area 108 size to receive at least one vessel 112 therein. As shown, the vessel 112 may comprise a conical vessel formed from the first vessel body 114 and at least a second vessel body 116. Optionally, the vessel 112 may be constructed from a monolithic body. Like the previous embodiment, the processing vessel 112 may be formed in any variety of shapes and configurations. At least one vessel passage 118 may be formed within the vessel 112, the vessel passage 118 being in fluid communication with inlet 122 coupled to or in close proximity to the plasma source 104 and the platen chamber 106. Like the previous embodiment, various elements of the microwave-assisted thermal ALD processing system 100, including the chamber 102, platen fixture 106, and/or the vessel 112 may be manufactured from any variety of materials. For example, the vessel 112 may be manufactured from stainless steel. Similarly, the chamber 102 may be manufactured from stainless steel.

Figure 6:
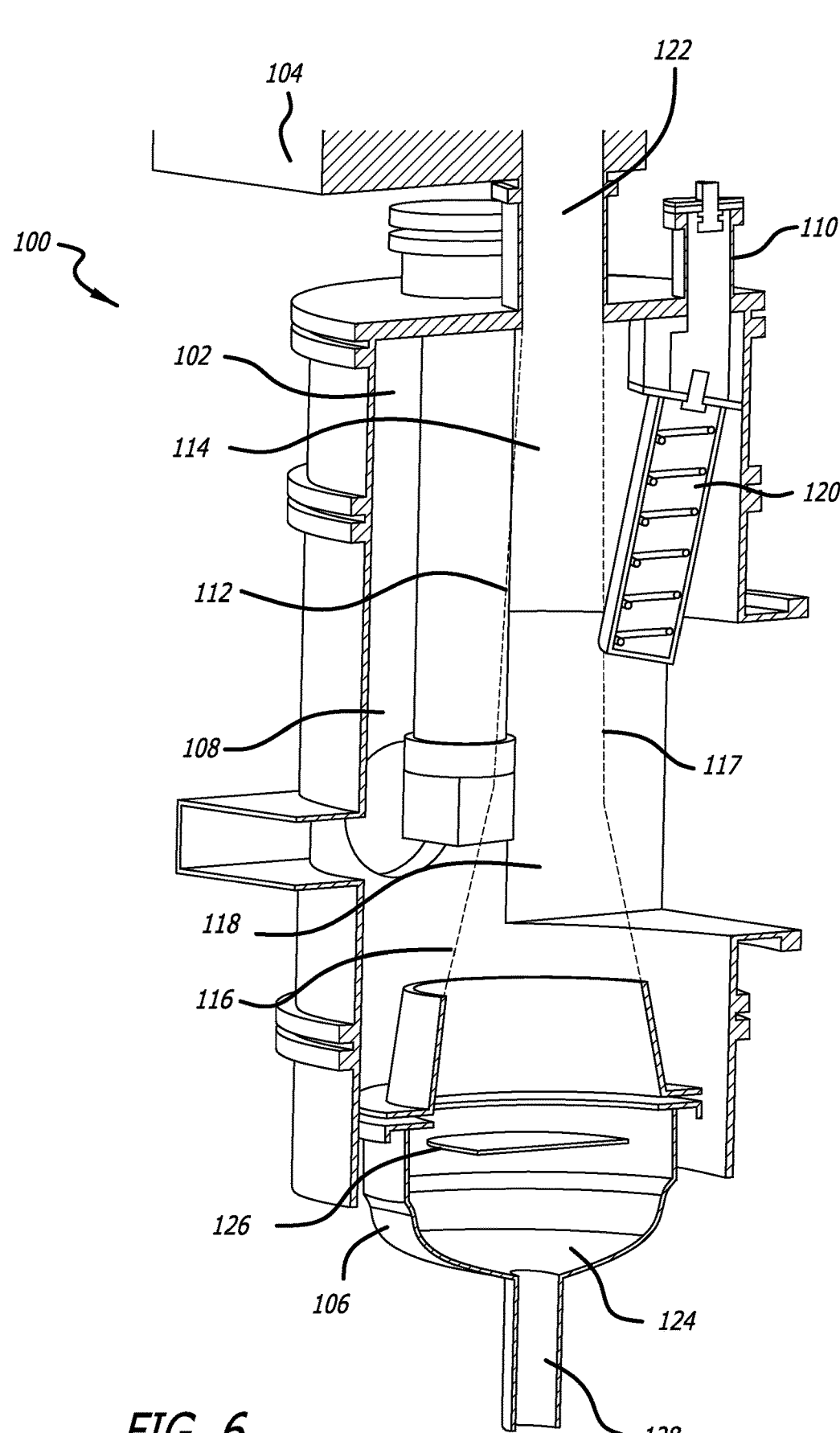
FIG. 6 shows a planar cross-sectional view of an embodiment of a microwave-assisted thermal ALD processing systems having at least one microwave antenna positioned on a processing vessel.
Figures 7, 8:
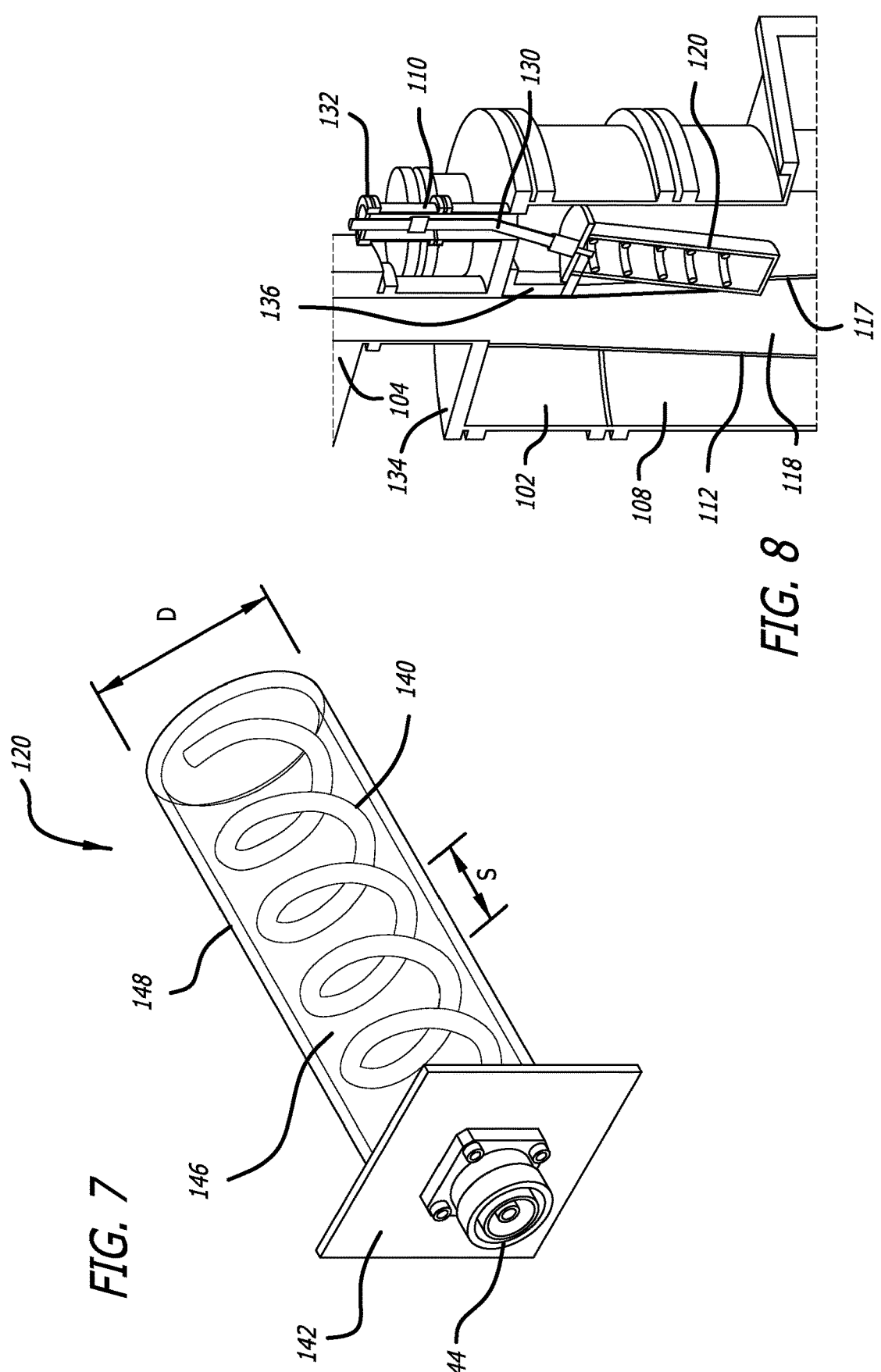
FIG. 7 shows an elevate perspective view of an embodiment of a helical microwave antenna for use with the microwave-assisted thermal ALD processing system shown in FIG. 6.
FIG. 8 shows a side planar cross-sectional view of the embodiment of the microwave antenna shown in FIG. 7 positioned within the chamber of the microwave-assisted thermal ALD processing system shown in FIG. 6.
Figure 9:
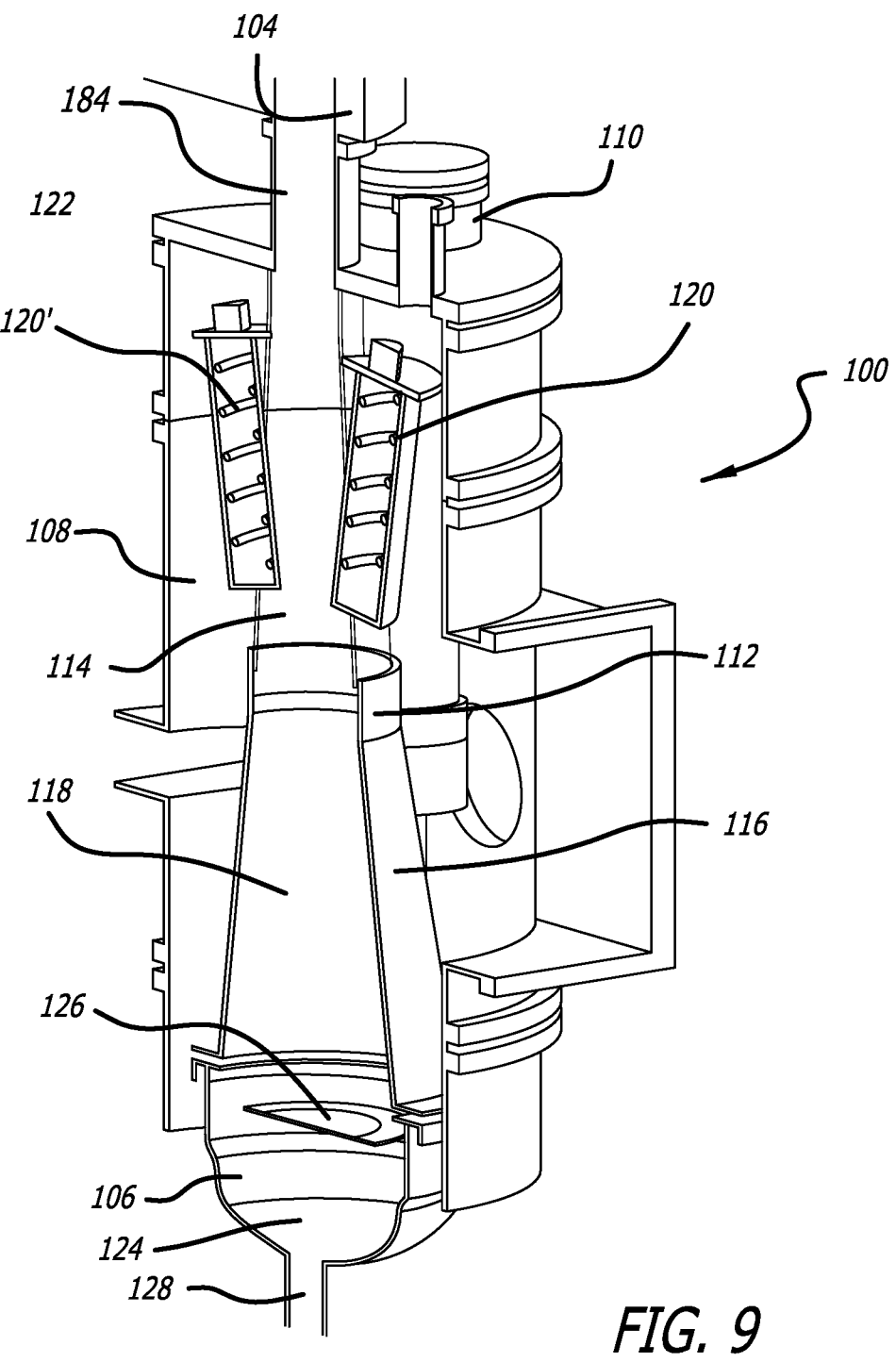
FIG. 9 shows an elevate cross-sectional view of an alternate embodiment of a microwave-assisted thermal ALD processing system utilizing two (2) microwave antenna to provide uniform microwave radiation of a substrate positioned in the platen chamber.

As shown, at least one antenna may be positioned within the chamber receiving area 108. For example, in the embodiments of the microwave-assisted thermal ALD processing system 100 shown in FIGS. 6-8 a single antenna 120 is used the project microwave radiation to a substrate (not shown) in the platen vessel 106. FIG. 9 shows an alternate embodiment wherein the microwave-assisted thermal ALD processing system 100 which includes a first antenna 120 and at least the second antenna 120' positioned within the chamber receiving area 108. Those skilled in the art will appreciate that any number and variety of antennas may be used the present system. Optionally, vessel 112 may include at least one window or similar pass-through thereby permitting radiation from the antenna 120 to traverse through the vessel 112. For example, FIGS. 6 and 7 show an embodiment of a vessel 112 having a window 117 formed thereon or therein. In the alternative, FIG. 9 shows an embodiment of a vessel 112 formed without a window formed therein. In another embodiment, the vessel 112 need not include the first vessel body 114 thereby permitting microwave radiation from the antenna 120 to traverse through the chamber receiving area 108 entering the vessel 112 through the second vessel body 116.

FIGS. 7 and 8 show a more detailed view of an embodiment of an antenna 120 and coupling system useful in positioning one or more antennas in the chamber receiving area 108. As shown in FIG. 7, in one embodiment the antenna 120 includes at least one radiating conduit 140. In one embodiment, the radiating conduit 140 comprises a substantially helical shape. For example, in the illustrated embodiment, the radiating conduit 140 comprises a five (5) turn helical winding. Optionally, the radiating conduit 140 may comprise a three (3) turn helical winding, a four (4) turn helical winding, a five (5) turn helical winding, a six (6) turn helical winding, or a seven (7) turn or more helical windings. The wire diameter of the radiating conduit 140 may range from about 0.005 inch to about 1.0 inch. In one specific embodiment, the wire diameter of the radiating conduit 140 ranges from about 0.125 inch to about 0.250 inch, although those skilled in the art will appreciate that any variety of wire diameters may be used. Optionally, any number of turns could be employed to form the helical winding. In one embodiment, the turn diameter D may range from about 0.5 inch to about 4.0 inches. Optionally, the turn diameter D may be about 1.54 inches. Optionally, the radiating conduit 140 may be manufactured having any variety of coil spacing. In one embodiment, the coil spacing S ranges from about 0.50 inch to about 2.5 inches. In another embodiment, the coil spacing S ranges from about 1 inch to about 1.5 inches. Optionally, the coil spacing S ranges is about 1.20 inches. Similarly, the radiating coil 140 may be manufactured with any desired coil pitch angles. For example, in one embodiment, the coil pitch angle is about 14 degrees, although any coil pitch angle may be used. Optionally, the antenna 120 may have a left or right circularly polarized. Those skilled in the art will appreciate that the antenna may be formed in any variety of alternate configuration and/or shapes. Exemplary configurations include, without limitations, helical shaped, conical shaped, parabolic shaped, horn shaped, leaky wave shaped, arrayed antennas, and the like. In one embodiment, the antenna is configured to generate at least one direction microwave radiation pattern selected to efficiently and selectively adjust the temperature of a substrate Referring again to FIG. 7, the radiating conduit 140 may be coupled to or otherwise in communication with at least one conductive grounding plate 142. For example, the conductive grounding plate 142 may have transverse dimensions ranging from about 1.0 inches by 5 inches with a thickness of about 0.05 inch to about 3.0 inches. For example, in one embodiment the conductive grounding plate 142 comprises a substantially square shape having a transverse dimension of about 3.5 inches×3.5 inches and a thickness of about 0.125" inch, although those skilled in the art will appreciate that the conductive grounding plate 142 may be manufactured in any variety of size, shapes, and configurations. Further, at least one of the radiating conduit 140 and grounding plate 142 may be coupled to or in communication with at least one connector 144 permitting the antenna to be coupled to at least one external power source, microwave source, and/or the like. In the illustrated embodiment, the radiating conduit 140 may be positioned within at least one envelope 146 formed by at least one encapsulating device 148. In one embodiment, the encapsulating device 148 may be configured protect the various elements (e.g. the radiating conduit 140) from the reactants and plasmas which may be present within the chamber 102. In one embodiment the envelope 146 is manufactured from quartz. In another embodiment, the envelope is manufactured from borosilicate, ceramic and sapphire materials, or any other dielectric materials which are transparent to microwave radiation.

As shown in FIG. 8, at least one antenna 120 may be supported within the chamber receiving area 108 by one or more antenna mounts 136 coupled to the chamber 102. In the illustrated embodiment, the antenna mount 136 is coupled to the chamber enclosure 134, although those skilled in the art will appreciate any variety of antenna mounts may be used. Further at least one conduit and/or cable 130 may be coupled to the connector 144 formed on the antenna 120 (See FIG. 7). The cable 130 may traverse through the chamber receiving area 108 exiting the chamber 102 via at least one port connector 132 positioned on at least one port 110 formed on the chamber 102.

Referring again to FIGS. 6-9, the platen vessel 106 may define at least one platen vessel chamber 124. Like the previous embodiments, at least one platen fixture 126 configured to receive and support at least one substrate (not shown) at a desired position within the platen vessel chamber 124. For example, in one embodiment, the platen fixture 126 is positioned such that at least a portion of the radiation emitted from the one or more antennas 120 included in the chamber 102. In one embodiment, at least one of the chamber 102, vessel 112, and/or the platen chamber 124 may be sized to receive one or more 100 mm or smaller wafer substrates therein. Optionally, at least one of the chamber 102, vessel 112, and/or the platen chamber 124 may be sized to receive one or more 100 mm or larger wafer substrates therein. During use, at least one substrate (not shown) may be positioned on or otherwise affixed to the platen fixture 126. Thereafter, the platen vessel 106 is coupled to the vessel 112 positioned within the chamber receiving area 108. In one embodiment, the platen vessel 106 is coupled to the vessel 112 in a hermetically sealed relation, although though skilled in the art will appreciate that the platen vessel 106 may be coupled to the vessel 112 in any variety of manners using any variety of coupling devices or fixtures. Once the chamber 102 is sealed a vacuum may be applied to at least one of the chamber receiving area 108 and/or the vessel passage 118. Thereafter, two or more reactants may be sequentially applied to the substrate thereby resulting in the formation of at least one atomic layer on the surface of the substrate. Microwave radiation from the antenna 120 may be used to maintain, and/or adjust the temperature of layers deposited on the substrate during the deposition process. For example, microwave radiation from the antennas 120 may be selectively applied to a freshly deposited film layer on the substrate. Thereafter any number of film deposition processes followed by any number of microwave radiation cycles may be selectively applied to the substrate. In one embodiment, the microwave radiation is uniformly applied to the substrate. In another embodiment, the microwave radiation is non-uniformly applied to the substrate. Optionally, once a desire layer thickness, and/or density has been deposited the introduction of reactants may be ceased and at least one plasma emitted from the plasma source 104 may be directed through the vessel passage 118 to the substrate within the platen chamber 106. However, those skilled in the art will appreciate that any variety of alternate post-ALD annealing processes may be performed to the substrate. As such, the systems and methods disclosed herein should not be construed as being limited to plasma-based processing systems.

Figure 10:
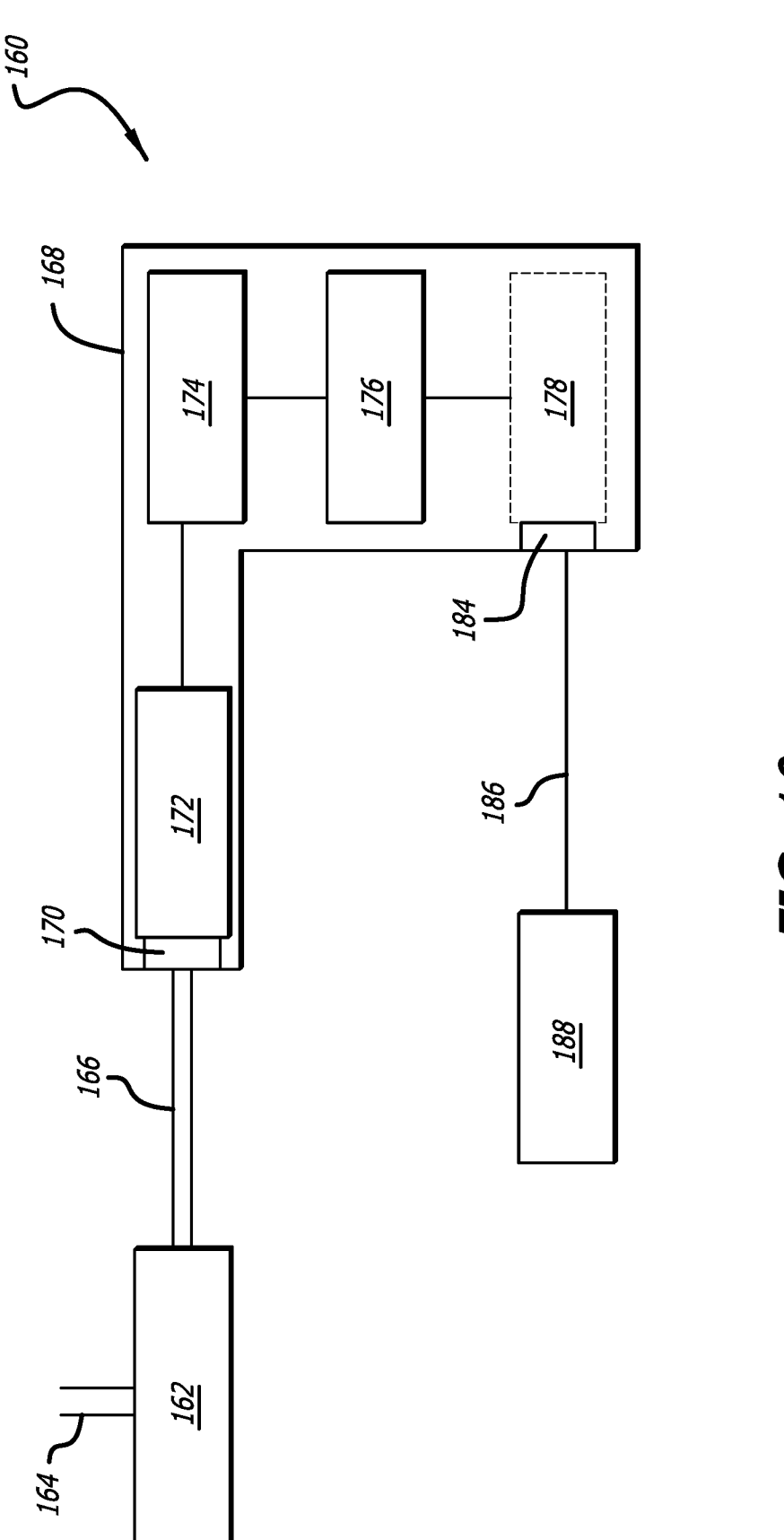
FIG. 10 shows a block diagram of an embodiment of a microwave system for use in a microwave-assisted thermal ALD processing system.

FIG. 10 shows a schematic diagram of an embodiment of a microwave system for use in microwave-assisted surface chemistry annealing of ALD processes. As shown, the microwave system 160 includes at least one microwave generator 162. In one embodiment, the microwave generator 162 comprises a solid state microwave generator, although those skilled in the art will appreciate that any variety of microwave generators may be used with the present system. In one embodiment, the microwave generator 162 is configured to output microwave energy or a microwave signal having a power ranging from about ten watts (10 W) to about ten thousand watts (10 kW). In another embodiment, the power ranges from about five hundred watts (500 W) to about two thousand watts (2 kW). In another embodiment, the power is about one thousand watts (1 kW). As such, as shown in FIG. 10, the microwave generator 162 may be cooled or otherwise thermally managed. For example, the microwave generator 162 may include at least one fluid port or conduit 164 permitting one or more fluids to be used to control the temperature of the microwave generator 162.

Referring again to FIG. 10, at least one conduit 166 may be coupled to or otherwise in communication with the microwave generator 162 and configured to transport microwave energy from the microwave generator 162. For example, the conduit 166 may comprise at least one coaxial cable, although any variety of conduits may be used include, without limitations, waveguides and the like. The conduit 166 may be coupled to one or more waveguide assemblies 168 via at least one transition member 170. In one embodiment, the transition member 170 may be configured to receive microwave energy from the conduit 166 (e.g. a coaxial cable) and couple the incoming energy into the waveguide assembly 170. Optionally, the transition member 170 may include one or more filter, polarizers, waveplates may include one or more quarter wavelength ($\frac{1}{4}\lambda$ devices) therein. At least one isolator 172 may be coupled to or in communication with the waveguide assembly 168. The isolator 172 may be configured to prevent backscatter or reflection of the microwave energy from the waveguide assembly 168 back to the microwave generator 162.

As shown in FIG. 10, the waveguide assembly 168 may include one or more tuning systems or devices 174 in communication with the isolator 172 thereby permitting selectable variation of the frequency of the microwave energy. In one embodiment, the tuning system 174 comprises an automatic tuning system permitting at least one processor (not shown) to vary at least one characteristic of the microwave energy from the microwave generator 162, including, for example, frequency, impendances, and the like. For example, the tuning system 174 may comprise the SmartMatch Intelligent Microwave Matching Unit manufactured by MKS Instruments, Inc., although those skilled in the art will appreciate that any variety of system capable of autonomously monitor and tune the microwave signal may be used.

In another embodiment, the tuning system 176 comprises a manual tuning system permitting the user to manually vary at least one characteristic of the microwave energy. Optionally, the tuning system 176 may be configured to act in coordination with the microwave generator 162. In another embodiment, the tuning system 176 may be configured to act in independent of the microwave generator 162. Further, the waveguide assembly 168 may include one or more detectors or sensors or directional couplers 174 therein. Exemplary detectors include, without limitations, precision power detectors, RF power detectors, and the like.

Referring again to FIG. 10, one or more optional devices or subsystems 178 may be included within the microwave system 160. For example, in the illustrated embodiment an optional system or device 178 is positioned within or proximate to the waveguide assembly 168. Exemplary optional systems 178 include, without limitations, noise filters, signal choppers, sensors, attenuators, power combiners, meters, polarizers, processors, control systems, thermal management systems, and the like. Optionally, an optional system 178, which may be used external of the waveguide assembly, including processors, controllers, filters, thermal management systems, coolant sources, and the like. In addition, at least one waveguide to coaxial transition device 184 may be used to couple the microwave energy from the waveguide assembly 168 into at least one coaxial conduit 186 coupled to the various embodiments of the microwave delivery device 188 positioned within a microwave-assisted thermal ALD system. Exemplary microwave delivery devices 188 include without limitations, waveguide device 56, 56' (see FIGS. 3-5) or antenna 120 (see FIGS. 6-9).

The embodiments disclosed herein are illustrative of the principles of the invention. Other modifications may be employed which are within the scope of the invention. Accordingly, the devices disclosed in the present application are not limited to that precisely as shown and described herein.

What is claimed:

1. A microwave-assisted thermal atomic layer deposition system for depositing an atomic layer on a substrate, the microwave-assisted thermal atomic layer deposition system comprising:

a conical processing vessel in a processing chamber, the conical processing vessel having a wide end, a narrow end; and a length defined between the wide end and the narrow end a platen vessel positioned at the wide end of the conical processing vessel and configured to receive and support the substrate;

at least one plasma source coupled to the narrow end of the conical processing vessel;

a microwave system including:

at least one microwave generator configured to output at least one microwave signal;

at least two waveguide assemblies configured to receive from the at least one microwave generator an input microwave signal via an input transition member, process the received input microwave signal, and output a processing microwave signal via an output transition member;

wherein each of the at least two waveguide assemblies are positioned at a non-parallel angle relative to a centerline of the length of the conical processing vessel;

wherein each of the at least two waveguide assemblies include:

the input transition member in communication with the at least one microwave generator and configured to receive, as the input microwave signal, the at least one microwave signal;

at least one isolator positioned within the at least two waveguide assemblies and configured to:

receive the input microwave signal from the at least one microwave generator;

reduce or eliminate backscatter of the received input microwave signal to the at least one microwave generator; and emit the received input microwave signal as an isolated microwave signal;

at least one tuning device positioned within each of the at least two waveguide assemblies, the at least one tuning device configured to:

receive the isolated microwave signal emitted from the at least one isolator;

tune the isolated microwave signal; and emit the tuned isolated microwave signal as a tuned microwave signal; and an output transition member positioned within the at least two waveguide assemblies to receive the tuned microwave signal and emit the tuned microwave signal as the processing microwave signal;

at least two microwave delivery devices, each in communication with a respective waveguide assembly of the at least two waveguide assemblies, and configured to:

receive the processing microwave signal from the at least two waveguide assemblies; and direct the processing microwave signal into the processing vessel of the microwave-assisted thermal atomic layer deposition system at a non-parallel angled direction of travel relative to the centerline of the length of the conical processing vessel, such that the at least two waveguide assemblies output the processing microwave signals in an angled direction of travel that is non-parallel relative to the centerline of the length of the conical processing vessel;

wherein the at least one isolator is positioned downstream from and directly coupled to an output of the at least one microwave generator and is positioned upstream from an input of the at least one tuning device;

wherein the two waveguide assemblies are configured to output the processing microwave signals such that, when the substrate is supported on the platen vessel:

the substrate is heated by the processing microwave signals to decrease the time needed to deposit an atomic layer on the substrate; and when the supported substrate is covered by a deposited atomic layer, the deposited atomic layer is heated by the processing microwave signals to decrease the time needed to deposit an additional atomic layer on the deposited atomic layer.

2. The microwave-assisted thermal atomic layer deposition system for depositing an atomic layer on a substrate of claim 1, further comprising at least one solid state microwave generator configured to output at least one microwave signal having a power from about 10 W to 10 KW.

3. The microwave-assisted thermal atomic layer deposition system for depositing an atomic layer on a substrate of claim 1, further comprising at least one solid state microwave generator configured to output at least one microwave signal having a power from about 500 W to 2 KW.

4. The microwave-assisted thermal atomic layer deposition system for depositing an atomic layer on a substrate of claim 1, further comprising at least one solid state microwave generator configured to output at least one microwave signal frequency ranging from 1000 MHz to 4000 MHz.

5. The microwave-assisted thermal atomic layer deposition system for depositing an atomic layer on a substrate of claim 1, further comprising at least one solid state microwave generator configured to output at least one microwave signal frequency ranging from 5700 MHz to 5800 MHz.

6. The microwave-assisted thermal atomic layer deposition system for depositing an atomic layer on a substrate of claim 1, further comprising at least one solid state microwave generator configured to output at least one microwave signal frequency ranging from 2400 MHz to 2500 MHz.

7. The microwave-assisted thermal atomic layer deposition system for depositing an atomic layer on a substrate of claim 1, wherein the at least one tuning device comprises an automatic tuning device configured to autonomously tune the isolated microwave signal.

8. The microwave-assisted thermal atomic layer deposition system for depositing an atomic layer on a substrate of claim 7, further comprising at least one detector device positioned within the at least two waveguide assemblies, the at least one detector device in communication with the at least one tuning device.

9. The microwave-assisted thermal atomic layer deposition system for depositing an atomic layer on a substrate of claim 8, wherein the at least one detector device comprises a precision power detector (PPD).

10. The microwave-assisted thermal atomic layer deposition system for depositing an atomic layer on a substrate of claim 1, wherein the at least one tuning device comprises a manual tuning device configured permit tuning of the isolated microwave signal.

11. The microwave-assisted thermal atomic layer deposition system for depositing an atomic layer on a substrate of claim 10, further comprising at least one directional coupler co-located with the at least one isolator and the at least one tuning device within the at least two waveguide assemblies, the directional coupler in communication with the at least one tuning device.

12. The microwave-assisted thermal atomic layer deposition system for depositing an atomic layer on a substrate of claim 1, wherein the at least one microwave delivery device is configured to emit the processing microwave signal comprising linearly polarized microwave signal.

13. The microwave-assisted thermal atomic layer deposition system for depositing an atomic layer on a substrate of claim 1, wherein the at least one microwave delivery device is configured to emit the processing microwave signal comprising a circularly polarized microwave signal.

14. The microwave-assisted thermal atomic layer deposition system for depositing an atomic layer on a substrate of claim 1, wherein the at least one microwave delivery device is configured to emit the processing microwave signal comprising an elliptically polarized microwave signal.

15. The microwave-assisted thermal atomic layer deposition system for depositing an atomic layer on a substrate of claim 1, wherein the at least one microwave delivery device is configured to emit the processing microwave signal comprising a microwave signal having a $TE_{11}$ mode.

16. The microwave-assisted thermal atomic layer deposition system for depositing an atomic layer on a substrate of claim 1, wherein the at least one microwave delivery device is configured to emit the processing microwave signal having a $TM_{01}$ mode.

17. The microwave-assisted thermal atomic layer deposition system for depositing an atomic layer on a substrate of claim 1, wherein the at least one microwave delivery device comprises a first microwave delivery device configured to emit a first processing microwave signal and at least a second microwave delivery device configured to emit at least a second processing microwave signal.

18. The microwave-assisted thermal atomic layer deposition system for depositing an atomic layer on a substrate of claim 17, wherein the polarization of the first processing microwave signal emitted from the first microwave delivery device and the polarization of at least a second processing microwave signal emitted from the at least a second microwave delivery device are the same polarization.

19. The microwave-assisted thermal atomic layer deposition system for depositing an atomic layer on a substrate of claim 17, wherein the polarization of the first processing microwave signal emitted from the first microwave delivery and the polarization of at least a second processing microwave signal emitted from the at least a second microwave delivery device are different polarizations.

20. The microwave-assisted thermal atomic layer deposition system for depositing an atomic layer on a substrate of claim 17, wherein the wavelength of the first processing microwave signal emitted from the first microwave delivery and the wavelength of at least a second processing microwave signal emitted from the at least a second microwave delivery device are the same wavelength.

21. The microwave-assisted thermal atomic layer deposition system for depositing an atomic layer on a substrate of claim 17, wherein the wavelength of the first processing microwave signal emitted from the first microwave delivery device and the wavelength of at least a second processing microwave signal emitted from the at least a second microwave delivery device are different wavelengths.

22. The microwave-assisted thermal atomic layer deposition system for depositing an atomic layer on a substrate of claim 1, wherein the at least one microwave delivery device comprises at least one waveguide coupled to and in communication with the processing vessel, the at least one waveguide configured to receive the at least one microwave signal from the at least one microwave generator and direct the at least one microwave signal into the processing vessel.

23. The microwave-assisted thermal atomic layer deposition system for depositing an atomic layer on a substrate of claim 1, wherein the processing vessel is a conical vessel configured to direct the processing microwave signal toward a substrate positioned in a platen vessel coupled to the conical vessel.

24. The microwave-assisted thermal atomic layer deposition system for depositing an atomic layer on a substrate of claim 1, wherein the input transition member is selected from the group consisting of a filter, a polarizer, and a waveplate.

25. The microwave-assisted thermal atomic layer deposition system for depositing an atomic layer on a substrate of claim 1, wherein the output transition member is a coaxial transition device.

* * * * *